United States Patent [19]
Shi

[11] Patent Number: 5,761,255
[45] Date of Patent: Jun. 2, 1998

[54] EDGE-SYNCHRONIZED CLOCK RECOVERY UNIT

[75] Inventor: Fong Shi, Bellevue, Wash.

[73] Assignee: The Boeing Company, Seattle, Wash.

[21] Appl. No.: 565,053

[22] Filed: Nov. 30, 1995

[51] Int. Cl.$^6$ ................................................ H04L 7/02
[52] U.S. Cl. .................... 375/360; 375/359; 375/361; 375/373; 327/142; 327/160; 331/1 A; 331/34
[58] Field of Search ........................ 375/373, 360, 375/361, 359, 376, 333, 282; 327/166, 165, 142, 141, 160; 331/34, 1 A

[56] References Cited

U.S. PATENT DOCUMENTS

| | | | |
|---|---|---|---|
| 3,602,828 | 8/1971 | Kurzweil, Jr. | 375/359 |
| 4,539,693 | 9/1985 | Boudault | 375/360 |
| 4,575,860 | 3/1986 | Scordo | 375/361 |
| 5,072,445 | 12/1991 | Nawata | 375/358 |
| 5,600,682 | 2/1997 | Lee | 375/360 |

OTHER PUBLICATIONS

M. Banu and A. E. Dunlop, *Clock Recovery Circuits with Instantaneous Locking*, Electronics Letters, Nov. 5, 1992, pp. 2127–2130.
AT&T Microelectronics, *Using the T7032 Clock Recovery and Data Retiming Circuit*, Technical Note, Jan. 1992.
AT&T Microelectronics, *T7032 Clock Recovery and Data Retiming Circuit*, Data Sheet, Jan., 1992.
AT&T Microelectronics, *T7035 Clock Recovery and Data Retiming Circuit*, Data Sheet, Oct. 1992.
Analog Devices, *Clock Recovery and Data Retiming Phase–Locked Loop*, AD803.
Analog Devices, *Clock Recovery and Data Retiming Phase–Locked Loop*, AD800/AD802.
Analog Devices, *Data Retiming Phase–Locked Loop*, AD805.

*Primary Examiner*—Stephen Chin
*Assistant Examiner*—Betsy L. Deppe
*Attorney, Agent, or Firm*—Christensen O'Connor Johnson & Kindness, PLLC

[57] ABSTRACT

A clock recovery unit for recovering a clock embedded in a data communication is disclosed. The clock recovery unit includes an oscillator (50) operating at a frequency close to that of the clock embedded in the data communication. The clock recovery unit also includes an edge detector (30) that produces a synchronization pulse with each transition in the data communication. The edge detector is coupled to the oscillator to force a transition in the oscillator in synchronization with the synchronization pulse produced by the edge detector. A start-up latch (10) that starts and stops the oscillator also forms part of the clock recovery unit. The start-up latch starts the oscillator at the beginning of the data communication, with no preamble bits required. For low-power consumption in stand-by mode, a counter (40) coupled to the start-up latch stops the oscillator after data has been determined not to be present for a preset period of time. Preferably, the start-up latch, edge detector, counter, and oscillator are incorporated into an Application Specific Integrated Circuit (ASIC).

28 Claims, 3 Drawing Sheets

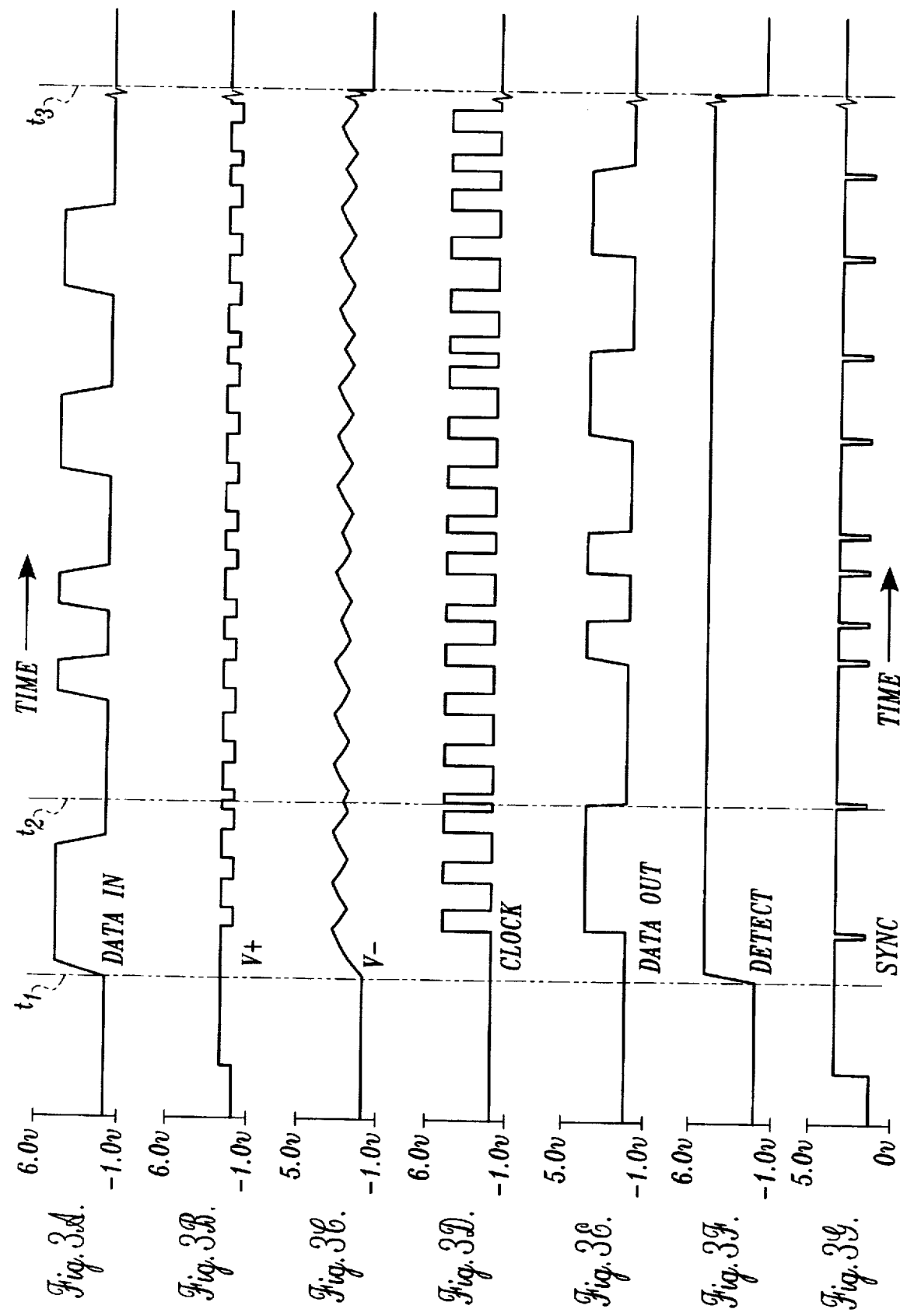

EDGE-SYNCHRONIZED CLOCK RECOVERY UNIT

FIELD OF THE INVENTION

The present invention relates to clock generators, and more particularly to a recovery unit for recovering the clock embedded in high-speed data communications.

BACKGROUND OF THE INVENTION

Many aircraft, satellites, and other complex systems include a number of subsystems having remote terminals that must communicate with a central computer that controls the system's overall operation. The remote and central terminals communicate by sending data over twisted-pair wires or, increasingly, fiber optic cables.

A number of communication protocols have been developed to standardize such remote terminal-to-central processor communications. For example, Military Standard 1553 (MIL-STD-1553) was developed as a communication protocol for Manchester-encoded data transmission over twisted-pair wires. Subsequently, Military Standard 1773 (MIL-STD-1773) was created to provide a similar protocol for data transmitted over fiber optic cables. These protocols generally employ data oversampling methods to ensure that data is successfully received. In accordance with the protocols, each received data bit is usually sampled 10 to 24 times using a local clock generator.

As data rates increase, traditional digital oversampling methods encounter major difficulties. For example, to transmit data at a rate of 20 megabits per second (Mbs), data would have to be sampled at 200 mega-samples per second to satisfy the minimum 10 times oversampling requirement. At this data rate, conventional CMOS devices cannot be used. In addition, high-speed bipolar ECL or GaAs devices cannot be used because they do not meet the low power requirements of some applications—space vehicles, for example.

High-speed hardware limitations can be overcome if oversampling is reduced or eliminated. For example, data transmitted at 20 megabits per second does not incur hardware implementation difficulties if it is not oversampled. The elimination of oversampling, however, causes synchronization to become increasingly important. One method of ensuring synchronization is to recover the clock from Manchester-encoded data for retiming the received data. This method typically employs a synchronized local clock that is compared with the clock information embedded in the incoming data. The local clock is continually adjusted to ensure that it remains synchronized with the data.

Current designs include phase-locked loops to achieve synchronization. In a typical phase-locked loop system, the phase of the incoming data is compared with the phase of a local clock in a phase detector. A single EXCLUSIVE-OR gate may be used as a simple phase detector. The output of the phase detector is passed through a low-pass filter and connected to the input of a voltage-controlled oscillator to speed up or slow down the oscillator so that the frequency of the oscillator output is the same as the frequency of the incoming data and so that the two signals are synchronized. Thus, the output of the voltage controlled oscillator forms a synchronized local clock. The continuously updated local clock that is produced by the voltage controlled oscillator is also the local clock that is connected to one of the inputs of the phase detector, so that the local clock is continually adjusted to the incoming data.

While phase-locked loop systems allow a higher data rate transmission without over sampling, they have the disadvantage of requiring an acquisition time from several dozen to several thousand preamble bit periods to successfully recover the clock. This high overhead is even more burdensome when operating in a burst mode. In a burst mode, the clock recovery unit must re-acquire the clock at the beginning of each new burst. In a phase-locked loop system, this means that the preamble must be repeated at the beginning of each burst. As a result, operating in a burst mode is especially inefficient. In addition, phase-locked loop systems have difficulty with Manchester encoding. With Manchester encoding, the duty cycle continually changes. This causes high bit error rates and can cause the clock to lose synchronization as the phase-locked loop continually seeks to adjust in response to the changes in duty cycle.

The present invention is directed to providing a clock recovery unit that overcomes the above-mentioned problems.

SUMMARY OF THE INVENTION

In accordance with this invention, a clock recovery unit for recovering the clock from high speed data communications is provided. The clock recovery unit includes an oscillator, an edge detector, and a start-up latch. The oscillator produces an output whose frequency is close to that of the clock embedded in the data. The incoming data is coupled to the edge detector, which generates a synchronization pulse that is synchronized with each transition in the data stream. The edge detector is coupled to the oscillator such that with each transition in the data stream, an edge detector synchronization pulse forces the oscillator into synchronization with the clock embedded in the data stream. The start-up latch is also connected to the incoming data so as to be set when data communication begins. The start-up latch is coupled to the oscillator so that the oscillator is enabled when the start-up latch is set. Thus, the oscillator begins running when a data communication begins.

In accordance with other aspects of this invention, the oscillator contains a comparator that produces a square-wave output whose frequency is defined by a resistor and a capacitor.

In accordance with further aspects of this invention, the edge detector contains a number of logic gates that are used to generate the synchronization pulses that are synchronized with each transition in the data stream. The edge detector is coupled, through a diode, to the comparator of the oscillator.

In accordance with still other aspects of this invention, the output of the start-up latch is coupled, through a diode, to the comparator of the oscillator. The start-up latch includes logic gates that control the enablement and disablement of the oscillator.

In accordance with still further aspects of this invention, the output of the start-up latch forms a detect signal that can be used by the central processor to provide an indication that data is present.

In accordance with yet other aspects of this invention, a counter is included. The counter counts the number of clock cycles during which no data is present. The output of the counter is coupled to the start-up latch. After the counter reaches a predetermined value, the counter output is toggled, which causes the output of the start-up latch to be reset, disabling the oscillator. The combination of the start-up latch and the counter saves power by allowing the oscillator to run only when data is present.

In accordance with yet further aspects of this invention, buffers are provided for the incoming data. The buffers ensure that the incoming data remains synchronized with the clock produced by the oscillator.

In accordance with still other aspects of this invention, several of the system components are incorporated into an Application Specific Integrated Circuit (ASIC). Specifically, the start-up latch, edge detector, counter, and buffers are constructed in a single ASIC. Incorporating the majority of the system components into an ASIC reduces the number of discrete components in the clock recovery unit, minimizing cost, size, and power consumption. The placement of components in a single ASIC additionally improves operation by reducing variations caused by temperature or construction.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 3A–3G are a series of waveforms of the type produced by the clock recovery unit of FIG. 1.

DETAILED DESCRIPTION OF THE PREFERRED EMBODIMENT

Figure 1:
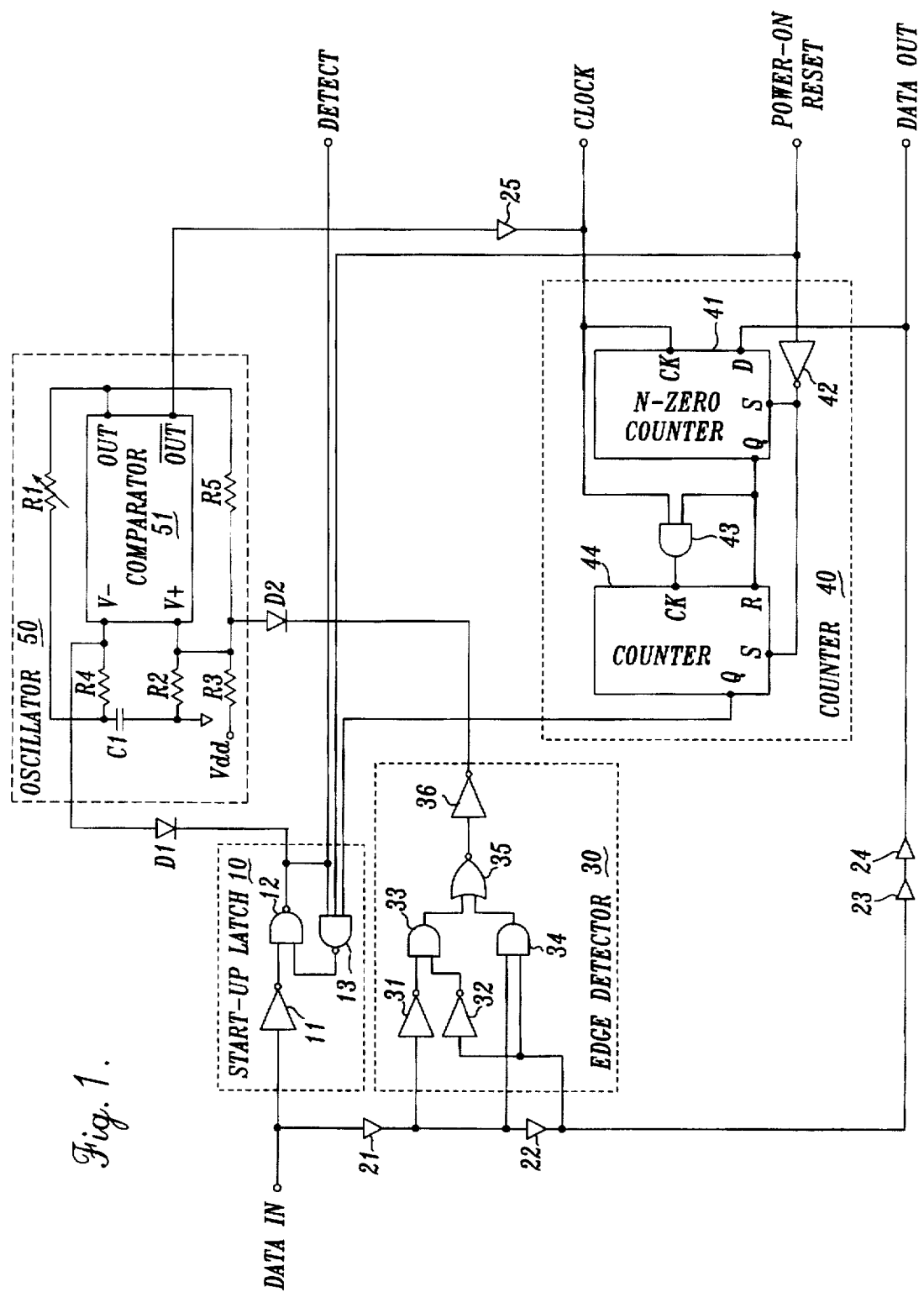
FIG. 1 is a block diagram of a clock recovery unit formed in accordance with this invention.

FIG. 1 is a block diagram of a clock recovery unit formed in accordance with this invention. As will be better understood from the following description, incoming data is received by the clock recovery unit. The clock recovery unit analyzes the data and outputs the received data as well as a clock that is synchronized to the data. In one actual embodiment of the invention, the incoming data is a Manchester-encoded 20 megabits per second signal based on a 40 megahertz clock. The clock recovery unit therefore recovers the 40 MHz clock that is embedded in the incoming data. Those skilled in the art will recognize that other encoding techniques and data rates may be used.

The clock recovery unit illustrated in FIG. 1 includes a start-up latch 10, an edge detector 30, a counter 40, and an oscillator 50. As will be better understood from the following description, incoming data is applied to the start-up latch 10, the edge detector 30, and the counter 40. When a data communication begins, the start-up latch enables the oscillator 50. The edge detector 30 generates a synchronization pulse each time a data bit transition occurs. The synchronization pulses are used to maintain the oscillator 50 in phase and frequency synchronization with the incoming data stream. The counter 40 counts the clock cycles produced by the oscillator when no data is present. After a predetermined number of cycles, the counter resets the start-up latch 10, disabling the oscillator 50.

Turning now to a more detailed description of the operation of the invention illustrated in FIG. 1, the oscillator 50 includes a comparator 51, a variable resistor designated R1, four fixed resistors designated R2, R3, R4, and R5, and a capacitor designated C1. The comparator 51 produces a logic one level at a noninverted output designated OUT when the voltage at a first input, designated V+, exceeds the voltage at a second input, designated V–. The comparator 51 also produces a logic zero level at an inverted output, designated $\overline{OUT}$, when the voltage at the first input V+ exceeds the voltage at the second input V–.

R1 is connected between the OUT output of the comparator 51 and a junction between R4 and C1. The other end of R4 is connected to the V– input of the comparator 51. The other end of C1 is connected to ground. R2 is connected between ground and the V+ input of the comparator 51. R3 is connected between a voltage reference source designated Vdd and the V+ input of the comparator 51. R5 is connected between the OUT output of the comparator 51 and the V+ input of the comparator 51.

The values of R1 and C1 are chosen such that the oscillator 50 oscillates at the desired frequency. In one actual embodiment of the invention, R1 is formed by a 100 ohm fixed resistor and a 100 ohm variable resistor, connected in series, and C1 is a 33 pF capacitor. The inclusion of a variable resistor allows the frequency of the oscillator 50 to be adjusted for an initial calibration.

The reference voltage at the V+ input of the comparator 51 is established by R2, R3, and R5. R2 and R3 form a voltage divider that establishes the reference voltage at the V+ of the input comparator 51. The feedback path created by R5 alters the reference voltage at the V+ input of the comparator 51 in conjunction with the value at the OUT output of the comparator 51. Thus, the reference voltage at the V+ input is lower when the value at the OUT output is a logic zero and it is higher when the value at the OUT output is a logic one. In one actual embodiment of the invention, resistors R2, R3, and R5 have values of 5.6 k ohms.

As C1 charges, the voltage at the V– input of the comparator 51 eventually exceeds the voltage at the V+ input. At the point when the voltage at the V–input exceeds the voltage at the V+ input, the OUT output of the comparator 51 drops to a logic zero level and the $\overline{OUT}$ output rises to a logic one level. This causes C1 to begin to discharge until the voltage at the V– input of the comparator 51 is less than the voltage at the V+ input, which causes the outputs of the comparator 51 to reverse back to their original logic states.

Those skilled in the art will recognize that the oscillator 50 may be implemented using any of a number of astable multivibrators, including, for example, frequency generators of the following types: RC, LC, relaxation, crystal, variable-frequency, resonant, negative-impedance, ring, phase-delayed, bridge, regenerative, and others.

The $\overline{OUT}$ output of the comparator 51 is connected to the input of a buffer 25. The clock recovered from the incoming data is the output of the buffer 25. Those skilled in the art will recognize that the clock could be taken from either output of the comparator 51, and that the comparator 51 need not have two outputs. Likewise, the present invention could be implemented with fewer or additional buffers.

As noted above, the operation of the oscillator 50 is enabled by the start-up latch 10. The start-up latch 10 comprises an inverter 11, a two-input NAND gate 12, and a three-input NAND gate 13. The incoming data is coupled to the inverter 11. When no data is present, the input of inverter 11 is a logic zero, while the output of the inverter 11 is a logic one. When the first data bit arrives the output of the inverter 11 shifts to a logic zero. Although not necessary for the operation of the present invention, the start-up latch 10 may also include a filter (not shown) to prevent the start-up latch 10 from enabling the oscillator 50 when a random noise spike is received.

The output of the inverter 11 is connected to one of the inputs of the two-input NAND gate 12. The other input of the two-input NAND gate 12 is coupled to the output of the three-input NAND gate 13. The output of the two-input NAND gate 12 is fed back into one input of the three-input NAND gate 13. A power on reset is coupled to another of the inputs of the three-input NAND gate 13. An output from a counter 40 (described below) is coupled to the third input of the three-input NAND gate 13. The outputs of the NAND gates 12 and 13 are logic level zero only when the value of all their respective inputs are at logic one level.

The start-up latch is in its reset state prior to receipt of data. In the reset state, a logic zero appears at the output of the two-input NAND gate 12, which forces the output of the three-input NAND gate 13 into a logic one level, conditioning the two-input NAND gate 12 to respond to the first transition of the first bit of an incoming data signal.

The output from the NAND gate 12 is coupled through a first diode D1 to the V− input of the comparator 51. When a logic level zero is present at the output of the NAND gate 12, the voltage present at the V− input of the comparator 51 will always be less than the voltage present at the first input V+ of the comparator 51. In this state, the oscillator 50 is disabled and the value of the $\overline{OUT}$ output of the comparator 51 will be zero. The oscillator 50 will remain in this state until a new burst of data arrives.

The edge detector 30 ensures that the oscillator 50 is synchronized with the incoming data. The edge detector 30 comprises first and second inverters 31 and 32, first and second AND gates 33 and 34, a NOR gate 35, and a third inverter 36. The incoming data passes through a first buffer 21 and a second buffer 22. The output of the first buffer 21 is coupled to the input of the first inverter 31, while the output of the second buffer 22 is connected to the input of the second inverter 32. The output of the first and second inverters 31 and 32 are connected to the inputs of the first AND gate 33. The outputs of the first and second buffers 21 and 22 are also each coupled to the inputs of the second AND gate 34. The outputs of the first and second AND gates 33 and 34 are connected to the inputs of the NOR gate 35. The output of the NOR gate 35 is connected to the input of the third inverter 36. The output of the third inverter 36 is a logic zero pulse synchronized with each transition or "edge" in the incoming data. The length of the logic zero pulse is determined by the delay created by the buffer 22. Those skilled in the art will recognize that the length of the logic zero pulse may be increased or decreased by increasing or decreasing the delay created by the buffer 22.

The output from the third inverter 36 is connected to the V+ input of the comparator 51 through a second diode D2. When a logic zero pulse is produced at the output of the edge detector 30, the voltage at the V+ input of the comparator 51 is forced to be lower than the voltage at the V− input of the comparator 51. The pulse from the edge detector 30 therefore forces the OUT output of the comparator 51 to a logic level zero, and the $\overline{OUT}$ output of the comparator 51 to a logic level one. Thus, the edge detector forces a clock transition whenever there is a transition in the incoming data.

In the embodiment of the invention shown in FIG. 1, the frequency of the oscillator 50 must be lower than or equal to the frequency of the recovered clock. This is because the edge detector as arranged according to FIG. 1 can only force a transition to speed up the oscillator 50. The values for the components of the oscillator 50 must therefore be chosen so that the frequency of the oscillator 50 is less than or equal to the frequency of the clock embedded in the incoming data. In addition, the oscillator frequency must be fast enough so that the edge detector 30 is able to pull it into synchronization with the clock embedded in the incoming data.

In general, the ratio of the frequency of the oscillator 50 to the frequency of the clock embedded in the incoming data is represented by $$F_o/F_c \geq (M-N)/M = 1-(N/M)$$

where M is the maximum number of recovered clock periods between data bit transitions; N is the fraction of M required to recover a data bit, accounting for variables such as circuit delay, set-up and hold time, and edge jitters; $F_o$ is the frequency of the oscillator 50; and $F_c$ is the frequency of the clock embedded in the data.

In one actual embodiment of this invention, the frequency of the oscillator 50 is designed with reference to MIL-STD-1773. Under this protocol, the greatest number of consecutive clock cycles during which the data may be logic zero is four. In addition, the worst case delay, jitters, set-up and hold time required by the protocol is one-half of the clock period. At the worst case, then, the clock recovery unit must recover four clocks in 3.5 clock cycles of the oscillator 50. Therefore, the ratio of the frequency of the oscillator 50 to the frequency of the clock embedded in the incoming data must be at least 3.5 divided by four, or 0.875. If the clock frequency of the incoming data is 40 megahertz, the frequency of the oscillator 50 must be at least 35 megahertz.

Figure 2:
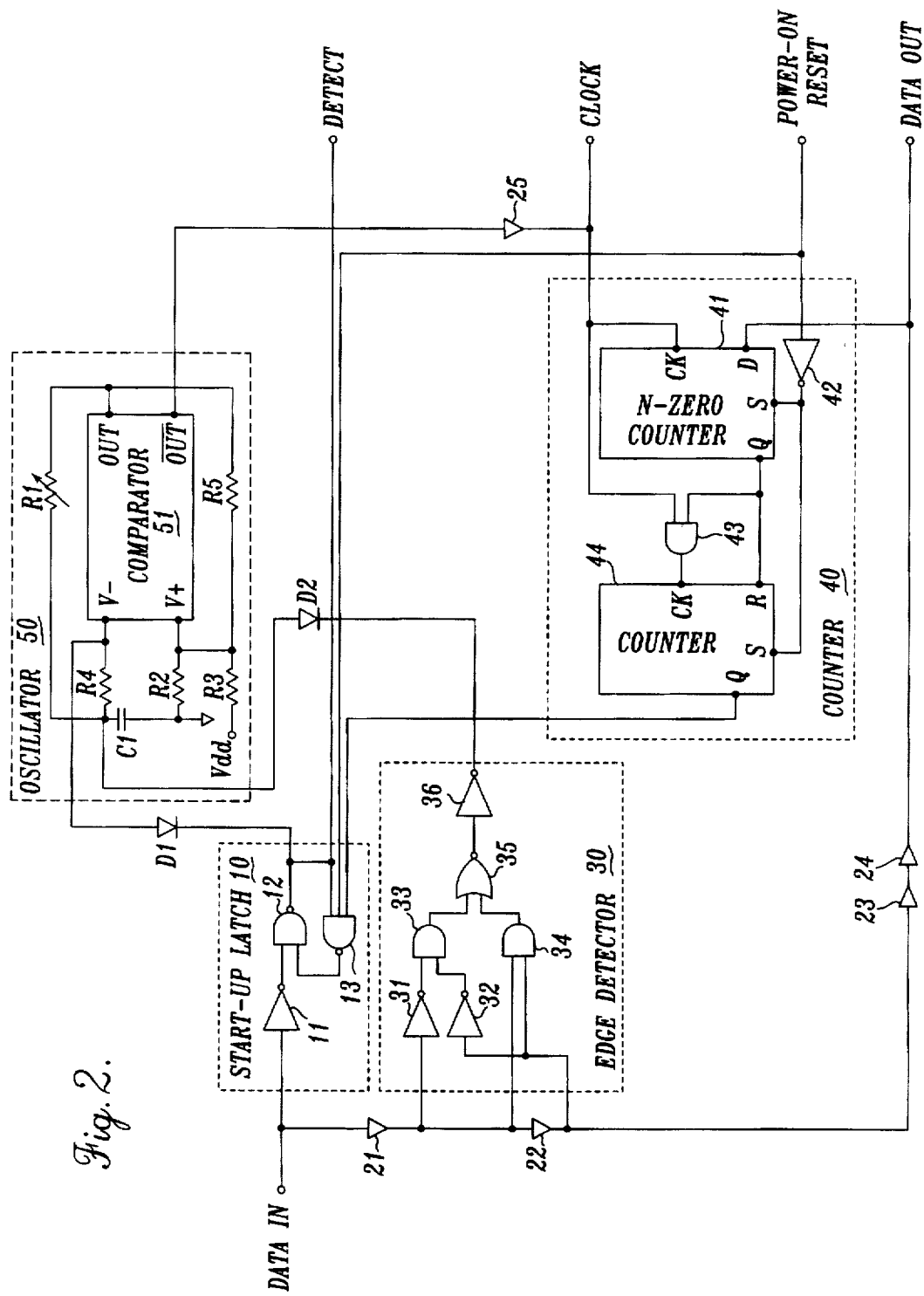
FIG. 2 is a block diagram of an alternate embodiment of a clock recovery unit formed in accordance with this invention.

In an alternate embodiment of this invention, the edge detector 30 can be used to slow down the oscillator 50 operating at a frequency greater than the frequency of the clock embedded in the incoming data. In this embodiment, shown in FIG. 2, the output from the third inverter 36 is connected to the V− input of the comparator 51 through the second diode D2. In this fashion, the logic zero pulse produced by the edge detector 30 in conjunction with a transition in the incoming data forces the voltage at the V−input of the comparator 51 to be lower than the voltage at the V+ input of the comparator 51. In turn, this forces the OUT output of the comparator 51 to be a logic one and the value of the $\overline{OUT}$ output of the comparator 51 to be at logic level zero. In this alternate embodiment, the frequency of the oscillator 50 must be greater than or equal to that of the clock embedded in the data. The ratio of the frequency of the oscillator 50 to the clock embedded in the incoming data is therefore represented by $$F_o/F_c \geq (M+N)/M = 1+(N/M).$$

Returning to FIG. 1, the counter 40 is provided to disable the oscillator after a predetermined number of clock periods during which no data has been present. The illustrated counter 40 is a two stage counter that comprises a first counter stage 41, an inverter 42, an AND gate 43, and a second counter stage 44. As will be better understand from the following description, the first counter stage 41 determines if data is not present for a predetermined number of cycles. If data is not present for the predetermined number of clock cycles, the first counter stage enables a gate that supplies clocks to the second counter stage. The second counter stage 44 counts to a preset value. When the preset value is reached, the output of the second counter stage is toggled.

The power on reset is connected to the input of the inverter 42. The output of the inverter 42 is connected to the set, S, inputs of the first and second counter stages 41 and 44. The incoming data from the output of the second buffer 22 is passed through a third buffer 23 and a fourth buffer 24. The output of the fourth buffer is the data out signal, which is a delayed version of the data in signal, the delay being determined by the first, second, third and fourth buffers 21, 22, 23, and 24.

The output of the fourth buffer 24 is connected to the data, D, input of the first counter stage 41. The clock, taken from the output of buffer 25, is connected to the clock, CK, input of the first counter stage 41. The first counter stage 41 counts logic zeros at its D input. Each logic one resets the counter stage. After a predetermined number of sequential logic zeros have been counted, the Q output of the first counter stage 41 rises from logic zero to logic one.

The Q output of the first counter stage 41 is connected to the reset, R, input of the second counter stage 44. The Q output of the first counter stage 41 is also connected to one input of the AND gate 43. The clock from the output of the buffer 25 is applied to the other input of the AND gate 43. The output of the AND gate 43 is connected to the clock, CK, input of the second counter stage 44. Thus, the second counter stage 44 only receives clocks when the Q output of the first counter stage 41 is at a logic one level.

The second counter stage 44 is held in a reset state by the low Q output of the first counter stage 41 until the first counter stage counts the predetermined number, e.g., six, of logic zeros. When this occurs, the Q output of the first counter stage shifts to a logic one level, removing the reset control from the second counter stage 44 and enabling the AND gate 43 to pass clocks. Thereafter, the second counter stage counts clock cycles until a preset value has been reached. When this occurs, the Q output of the second counter stage 44 drops to a zero logic level indicating that no data has been present for the predetermined time period and there is no need for further clock recovery. In an actual embodiment of this invention, the second counter 44 was set to count for 750 nanoseconds. Because the Q output of the second counter 44 is connected to one of the inputs of the three input NAND gate 13 of the start-up latch 10, the start-up latch 10 is reset when the Q output of the second counter stage drops to a zero logic level. Resetting the start-up latch occurs because the output of the two-input NAND gate 12 is at a logic one level and the power-on reset is at a logic one level. The shift of the Q output of the second counter stage 44 from a logic one level to a logic zero level causes the output of the three-input NAND gate 13 to shift from a logic zero level to a logic one level. This causes the output of the two-input NAND gate 12 to shift from a logic one level to a logic zero level since the output of the inverter 11 is at a logic one level due to the absence of data. As a result, the start up latch 10 disables the oscillator 50.

In an actual embodiment of the invention of this invention, the start up latch 10, edge detector 30, counter 40, and buffers 21 through 25 are incorporated onto a single Application Specific Integrated Circuit (ASIC). Preferably, however, all of the components of the present invention are incorporated onto a single ASIC. This brings a number of advantages in the size and simplicity of the construction. In addition, it ensures that there are minimal timing problems caused by variations in the construction of different devices. It also ensures that all of the components incorporated onto the ASIC are similarly affected by changes in operating temperature.

FIGS. 3A–3G are a series of waveforms of the type produced by the clock recovery unit of FIG. 1. The illustrated positive and negative voltage levels are for reference only and should not be construed as limiting. As shown in FIG. 3A, at time $t_1$ incoming data arrives, which causes the detect signal, shown in FIG. 3F, to transition from a logic zero to a logic one. The voltages present at the V+ input and the V− input of the comparator 51 are shown in FIGS. 3B and 3C, respectively. The synchronization pulses generated by the edge detector 30 are shown in FIG. 3G. At time $t_2$, a transition in the incoming data (FIG. 3A) results in a synchronization pulse produced by the edge detector 30. As shown in FIG. 3G, the synchronization pulse is delayed by the time required to travel through the logic gates of the edge detector 30. As a result, the synchronization pulse approximately coincides with the same transition in the data out signal. See FIG. 3E. In any event, the synchronization pulse causes a transition in the clock as shown in FIG. 3D. This causes the charging capacitor C1 to begin to discharge as shown in FIG. 3C. The data out (FIG. 3E) is simply the data in (FIG. 3A) delayed by buffers 21, 22, 23, and 24. At time $t_3$, after the data communication has ended for the period determined by the counter 40, the detect signal drops to a logic zero and the oscillator 50 is disabled, causing the clock to remain at a logic zero level, as shown in FIG. 3D.

A clock recovery unit formed in accordance with the present invention offers many advantages over the prior art. Most importantly, clock information embedded in high data rate burst data communications can be quickly recovered. Unlike the devices of the prior art, a clock recovery unit formed in accordance with the present invention allows nearly immediate clock recovery, without the use of inefficient, lengthy preambles. In fact, the clock recovery unit of the present invention requires no preamble bits while clock recovery units of the prior art require as many as 300,000 preamble bits. Although the clock recovery unit of the present invention provides a number of advantages when used with burst data communications, those skilled in the art will recognize that it will also work with continuous mode signals.

Additionally, the clock recovery unit of the present invention recovers the clock more accurately than the devices of the prior art. This is especially true when the data communication is burst data. Tests have shown some clock recovery units to have as many as 1,200 errors in 6,400 bits when operating on burst data. With the clock recovery unit of the present invention, the bit error rate is essentially zero. In a test of an actual embodiment of the present invention, zero bit errors were recorded out of $10^{10}$ data bits received.

Still another advantage is provided by the use of the start up latch 10 and the counter 40 to save power. By starting the operation of the oscillator 50 when data arrives, and stopping the operation of the oscillator 50 when data is no longer present, the power consumed by the clock recovery unit of the present invention is minimized.

Yet another advantage is that the clock recovery unit of the present invention may be implemented using conventional CMOS devices. Because the clock recovery unit of the present invention allows the accurate recovery of data transmissions without oversampling, the use of GaAs or other expensive devices may be avoided. As a result, cheaper, power-saving devices may be used.

While the preferred embodiment of the invention has been illustrated and described, it will be appreciated that various changes can be made therein without departing from the spirit and scope of the invention. In this regard, those skilled in the art will recognize that while a two-stage counter is used to determine when data is no longer present, the same result could be accomplished by a single stage. In addition, if a power saving mode was not required, the counter 40 can be eliminated without reducing the effectiveness of the clock recovery unit.

While it is an advantage of the present system to incorporate most or all of the components onto a single ASIC, it will also be appreciated that embodiments of the present invention can be constructed in other forms. For example, separate integrated or printed circuit board circuits designed to accomplish the functions of the start-up latch, the edge detector, the oscillator and the counter can be employed.

Those skilled in the art will further appreciate that the present invention can be implemented using logic gates arranged other than as described in the preferred embodiment. That is, as long as close attention is paid to the effect it has on timing, alternate logic gate arrangements may be substituted for those described above. Consequently, within the scope of the claims it will be appreciated that the invention can be practiced otherwise than as specifically described herein.

The embodiments of the invention in which an exclusive property or privilege is claimed are defined as follows:

1. A clock recovery unit for recovering the clock embedded in a data communication, comprising:
   (a) an oscillator having a normal operating frequency that is close to the frequency of the clock embedded in a data communication;
   (b) an edge detector having an input for receiving the data communication and an output connected to the oscillator to force a transition in the oscillator with each transition occurring in the data communication in order to maintain synchronization between the oscillator frequency and the frequency of the clock embedded in the data communication; and
   (c) a start-up latch having an input for receiving the data communication and an output connected to the oscillator to synchronize the oscillator with the clock embedded in the data when the data communication begins.

2. The clock recovery unit of claim 1, wherein the normal operating frequency of the oscillator is lower than or equal to the frequency of the clock embedded in the data communication and the edge detector is connected to the oscillator such that the oscillator frequency is increased in order to maintain synchronization between the frequency of the oscillator and the frequency of the clock embedded in the data communication.

3. The clock recovery unit of claim 1, wherein the normal operating frequency of the oscillator is higher than or equal to the frequency of the clock embedded in the data communication, and the edge detector is connected to the oscillator such that the oscillator frequency is decreased in order to maintain synchronization between the frequency of the oscillator and the frequency of the clock embedded in the data communication.

4. The clock recovery unit of claim 1, wherein the output of the start-up latch forms a detect signal that indicates that a data communication is being received.

5. The clock recovery unit of claim 1, further comprising a counter coupled to the start-up latch for resetting the start-up latch at the end of a data communication.

6. The clock recovery unit of claim 5, wherein the normal operating frequency of the oscillator is lower than or equal to the frequency of the clock embedded in the data communication and the edge detector is connected to the oscillator such that the oscillator frequency is increased in order to maintain synchronization between the frequency of the oscillator and the frequency of the clock embedded in the data communication.

7. The clock recovery unit of claim 5, wherein the normal operating frequency of the oscillator is higher than or equal to the frequency of the clock embedded in the data communication, and the edge detector is connected to the oscillator such that the oscillator frequency is decreased in order to maintain synchronization between the frequency of the oscillator and the frequency of the clock embedded in the data communication.

8. The clock recovery unit of claim 5, wherein the counter comprises:
   (a) a first counter stage for determining when data is no longer present for a predetermined number of clock periods; and
   (b) a second counter stage coupled to the first counter stage for applying a reset signal to the start-up latch a predetermined period of time after the first counter stage determines that data has not been present for a predetermined number of clock periods.

9. The clock recovery unit of claim 8, wherein the start-up latch, the edge detector, and the counter are incorporated into an Application Specific Integrated Circuit.

10. The clock recovery unit of claim 8, wherein the incoming data communication is a Manchester-encoded burst communication operating at 20 megabits per second.

11. The clock recovery unit of claim 8, wherein the oscillator includes a comparator and a resistor and a capacitor connected in a feedback path so as to control the frequency of the oscillator.

12. The clock recovery unit of claim 11, wherein the comparator has first and second inputs and wherein the edge detector is coupled to the first input of the comparator through a diode.

13. The clock recovery unit of claim 11, wherein the comparator has first and second inputs and wherein the edge detector is coupled to the second input of the comparator through a diode.

14. A method for recovering a clock embedded in a data communication, comprising:
   (a) producing a clock having a frequency close to the frequency of the clock embedded in the data communication;
   (b) producing a synchronization pulse synchronized with each transition in the data communication; and
   (c) forcing the frequency of the clock having a frequency close to the frequency of the clock embedded in the data communication into synchronization with the clock embedded in the data communication by forcing a transition in the clock having a frequency close to the frequency of the clock embedded in the data communication using the synchronization pulse and beginning contemporaneously with the beginning of the data communication.

15. The method of claim 14, further comprising stopping the production of the clock having a frequency close to the frequency of the clock embedded in the data communication when the data communication ends.

16. A clock recovery unit for recovering a first clock embedded in a data communication, comprising:
   (a) means for producing a second clock having a normal operating frequency that is close to the frequency of the clock embedded in a data communication;
   (b) means for forcing a transition in the second clock with each transition occurring in the data communication in order to maintain synchronization between the frequency of the second clock and the frequency of the first clock embedded in the data communication; and
   (c) means for initiating the production of the second clock and the frequency synchronization of the first and second clocks when the data communication begins.

17. The clock recovery unit of claim 16, wherein the normal operating frequency of the second clock is lower than or equal to the frequency of the first clock embedded in the data communication and the means for producing a second clock is responsive to the forcing means such that the second clock frequency is increased in order to maintain synchronization between the frequency of the second clock and the frequency of the first clock embedded in the data communication.

18. The clock recovery unit of claim 16, wherein the normal operating frequency of the second clock is higher than or equal to the frequency of the first clock embedded in the data communication and the means for producing a second clock is responsive to the forcing means such that the second clock frequency is decreased in order to maintain synchronization between the frequency of the second clock and the frequency of the first clock embedded in the data communication.

19. The clock recovery unit of claim 16, wherein the initiating means forms a detect signal that indicates that a data communication is being received.

20. The clock recovery unit of claim 16, further comprising means for resetting the initiating means at the end of a data communication.

21. The clock recovery unit of claim 20, wherein the normal operating frequency of the second clock is lower than or equal to the frequency of the first clock embedded in the data communication and the means for producing a second clock is responsive to the forcing means such that the second clock frequency is increased in order to maintain synchronization between the frequency of the second clock and the frequency of the first clock embedded in the data communication.

22. The clock recovery unit of claim 20, wherein the normal operating frequency of the second clock is higher than or equal to the frequency of the first clock embedded in the data communication and the means for producing a second clock is responsive to the forcing means such that the second clock frequency is decreased in order to maintain synchronization between the frequency of the second clock and the frequency of the first clock embedded in the data communication.

23. The clock recovery unit of claim 20, wherein the resetting means comprises:

(a) means for determining when data is no longer present; and (b) means for applying a reset signal to the initiating means a predetermined period of time after the determining means determines that data is no longer present.

24. The clock recovery unit of claim 23, wherein the producing means, forcing means, and initiating means are incorporated into an Application Specific Integrated Circuit.

25. The clock recovery unit of claim 23, wherein the incoming data communication is a Manchester-encoded burst communication operating at 20 megabits per second.

26. The clock recovery unit of claim 24, wherein the producing means includes a comparator and a resistor and a capacitor connected in a feedback path so as to control the frequency of the second clock.

27. The clock recovery unit of claim 26, wherein the comparator has first and second inputs and wherein the forcing means is coupled to the first input of the comparator through a diode.

28. The clock recovery unit of claim 26, wherein the comparator has first and second inputs and wherein the forcing means is coupled to the second input of the comparator through a diode.

* * * * *